(12) United States Patent
Brandl

(10) Patent No.: US 6,395,585 B2
(45) Date of Patent: May 28, 2002

(54) METHOD FOR HOUSING SENSORS IN A PACKAGE

(75) Inventor: Manfred Brandl, Gratwein (AT)

(73) Assignee: Austria Mikro Systeme International Aktiengesellschaft, Unterpremstätten (AT)

( * ) Notice: Subject to any disclaimer, the term of this patent is extended or adjusted under 35 U.S.C. 154(b) by 0 days.

(21) Appl. No.: 09/804,148

(22) Filed: Mar. 13, 2001

(30) Foreign Application Priority Data

Mar. 14, 2000 (AT) ............................................. 420/00

(51) Int. Cl.⁷ ............................................. G01N 33/00
(52) U.S. Cl. ........................... 438/127; 438/64; 438/51; 438/106
(58) Field of Search ........................... 438/106, 48, 57, 438/64, 65, 116, 127, 51

(56) References Cited

U.S. PATENT DOCUMENTS 4,697,203 A * 9/1987 Sakai et al. .................... 357/72
5,424,249 A * 6/1995 Ishibashi ..................... 437/211
5,622,873 A * 4/1997 Kim et al. ..................... 438/65
5,897,338 A * 4/1999 Kaldenberg ................. 438/116
6,188,118 B1 * 2/2001 Severn ........................ 257/432

FOREIGN PATENT DOCUMENTS

DE          19929025 A1 * 12/2000 ........... H01L/21/56

* cited by examiner

Primary Examiner—Richard Elms
Assistant Examiner—Adam Pyonin
(74) Attorney, Agent, or Firm—Kevin E. Joyce

(57) ABSTRACT

A method for housing sensors in a package and, in particular, housing chemical sensors, flow sensors or optical sensors in a synthetic package. In a first step, the active sensor surface of a semiconductor or IC sensor is provided with a cap forming a hollow space above the active sensor surface and the sensor is connected with contacts and bond wires. In a second method step, the package is formed by molding, in particular injection molding. In a third method step, or simultaneously with the second method step, the hollow space formed above the active sensor surface is opened.

9 Claims, 2 Drawing Sheets

METHOD FOR HOUSING SENSORS IN A PACKAGE

BACKGROUND OF THE INVENTION

1. Field of the Invention

The invention relates to a method for housing sensors in a package and, in particular, housing chemical sensors, flow sensors or optical sensors in a synthetic package.

2. Prior Art

Chemical sensors, like flow sensors or optical sensors, may be manufactured already in an integrated form in a cost-effective manner and at a high precision by conventional chip manufacturing processes. However, such IC sensors or chip sensors subsequently had to be incorporated in a package, which involved cumbersome assembly work, whereby the package, as a rule, was either screwed or glued and the connections to the sensors had to be led out of the package in a suitable manner. This applied not only to the electrical connections, but, in the case of chemical sensors, flow rate sensors or optical sensors, naturally also to line connections or optical fiber connections, which called for appropriate additional adaptation work of the packages. Thus, in the production of such sensors, incorporation in a package constituted a cost-determining factor for mass production.

SUMMARY OF THE INVENTION

The invention aims to provide a method of the initially defined kind, by which the assembly work involved can be substantially reduced and the necessary connections can, at the same time, be provided in a cost-effective manner by a few method steps. To solve this object, the method according to the invention essentially consists in that, in a first method step, the active sensor surface of a semiconductor or IC sensor is provided with a cap forming a hollow space above the active sensor surface and the sensor is connected with contacts and bond wires, that, after this, the package is formed by molding, in particular injection molding, and that, in a third method step or simultaneously with the second method step, the hollow space formed above the active sensor surface is opened. In principle, chip molding with a suitable molding compound is known for many electronic components. Yet, none of the known methods is suitable for sensors which require to be in contact with the atmosphere, since after molding the sensor will no longer be accessible without cumbersome aftertreatment and the risk of damage to the sensor cannot be excluded in case of subsequent adaptation work. Due to the fact that, according to the invention, the active sensor surface of a semiconductor or IC sensor is provided with a cap forming a hollow space above the active sensor surface in a fist method step, the respective active sensor surface is kept free of the molding compound to be applied subsequently. The provision of bond wires as is common in chip manufacturing may be accomplished in a simple manner by conventional means, wherein, by a subsequent molding procedure, in particular an injection molding procedure, a finished component already comprising all electrical contacts is immediately provided. Thus, it merely has to be safeguarded that the active sensor surface in a suitable manner will again be in contact with the environment, to which end the hollow space is mechanically opened either during the second method step simultaneously with the casting-on or molding of the package or following this second method step. The opening of the hollow space in a third method step carried out subsequently is preferred to the simultaneous formation of the opening not the least because the simultaneous opening of the hollow space requires that the wall of the cap defining the hollow space be pierced immediately upon closure of the mold or injection mold, respectively. Since the injection molding compound, as a rule, has not set at that point of time, this will cause the previously positioned sensor to be displaced within the molding compound if no suitable abutment is provided on the opposite side. If injection molding is performed at an accordingly higher pressure, it will also have to be ensured in such a case that the mold will tightly sever the cap in order to prevent molding compound from being pressed into the hollow space. In the context of the method according to the invention, it is, therefore, advantageously proceeded such that the hollow space is opened by sawing and/or drilling after the at least partial setting of the molding compound.

In a particularly simple manner, the package may be made of suitable synthetics, a number of synthetics having proved to be suitable in semiconductor technology.

If an optical sensor is employed, the hollow space advantageously may be opened by drilling, whereupon an optical fiber is introduced into the opened hollow space.

In order to ensure the simultaneous formation of the electrical contacts with a view to inserting such a sensor provided with a package into a base or an appropriately prepared printed circuit board, it may advantageously be proceeded in a manner that the bond wires are connected with a frame including contact pins and that the frame is embbed in the molding compound leaving free the contact pins.

BRIEF DESCRIPTION OF THE DRAWINGS

In the following, the invention will be explained in more detail by way of the individual method steps schematically illustrated in the drawing. Therein.

DETAILED DESCRIPTION OF PREFERRED EMBODIMENTS

Figure 1:
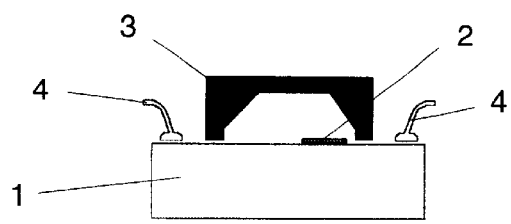
FIG. 1 illustrates a section through a sensor.

FIG. 1 depicts an IC sensor 1 whose sensor surface 2 is housed on the external side of the IC. In the first method step, a cap 3 forming a hollow space above the active sensor surface 2 is put on and electrical contacting is effected via bond wires 4.

Figure 2:
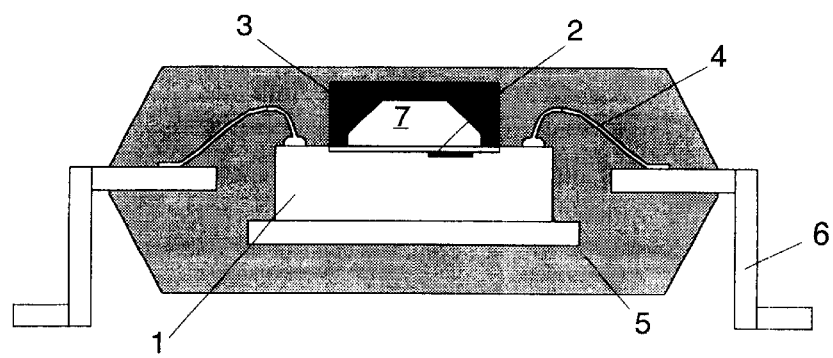
FIG. 2 is a section through the sensor incorporated in a package.

From FIG. 2, the schematically represented package 5 is apparent after the injection molding procedure. A lead frame 6 comprising the respective bond wires is already integrated in the package 5, the hollow space 7 left being visible above the active sensor surface 2.

Figure 3:
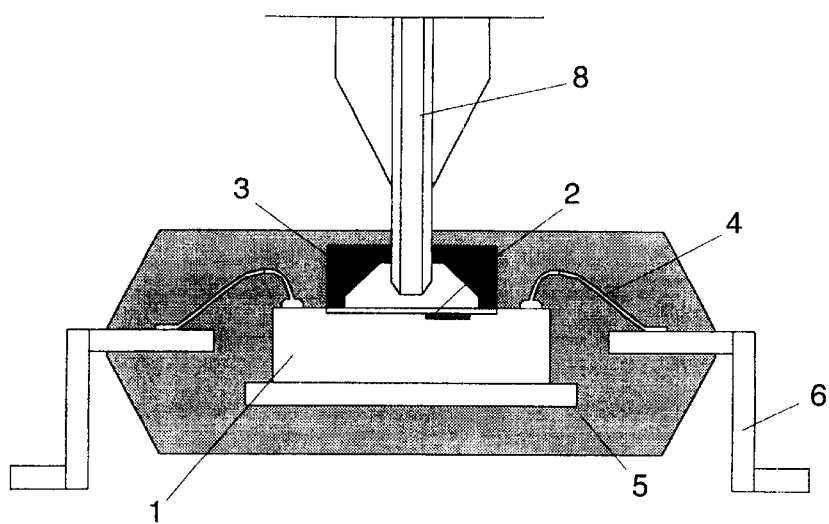
FIG. 3 is a sectional view analogous to FIG. 2, schematically illustrating an operating tool intended to open the hollow space.

In the illustration according to FIG. 3, a saw is indicated at 8, by which the external wall of the package 5 and the cover cap 3 are appropriately severed so as to create an open connection to the hollow space 7 containing the active sensor element 2.

Figure 4:
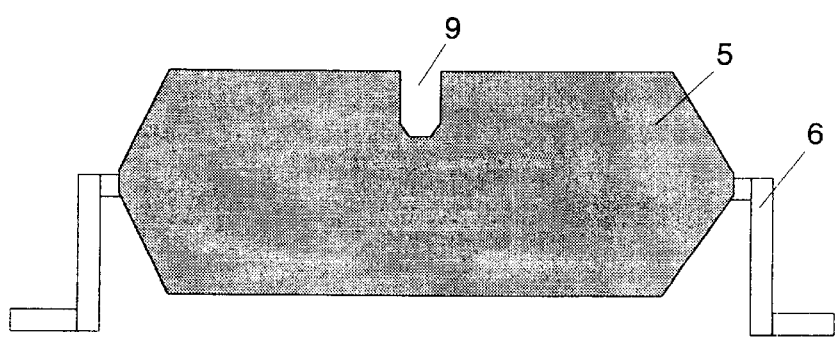
FIG. 4 is a view of the sensor upon opening of the hollow space.

FIG. 4 illustrates the thus produced sensor, showing its opening 9 which enables the active sensor element 2 contained in the interior of the package 5 to communicate with the atmosphere.

Figure 5:
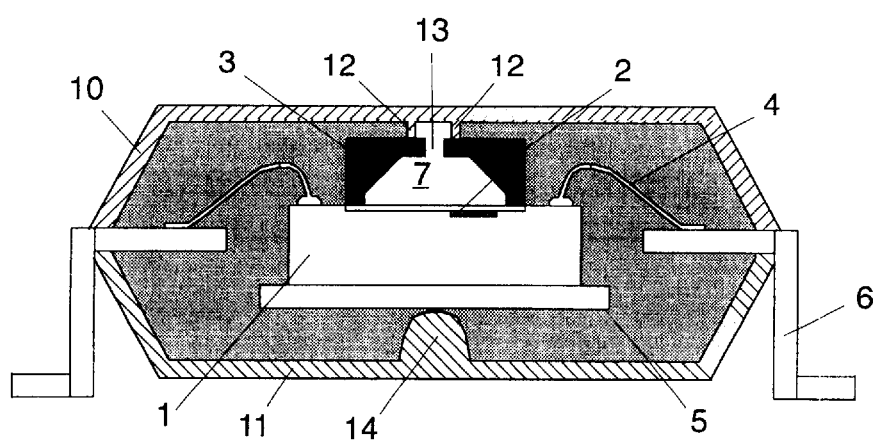
FIG. 5 shows an alternative method step for the formation of the opening of the hollow space in an illustration analogous to FIG. 2.

FIG. 5 once again elucidates the method step for the production of the package under the simultaneous formation of an opening in an illustration analogous to FIG. 2. With this mode of operation, the method step of subsequently providing the opening of the hollow space indicated in FIG. 3 may be obviated. In the instant configuration, the cap 3 forming the hollow space does already comprise an interruption, the injection mold thus having to be modified accordingly. The mold consists of a first mold half 10 and a second mold half 11, wherein the first mold half 10, which is located adjacent to the cap 3, comprises inwardly projecting webs 12 which are sealingly pressed at the cap outside the interruption 13 of the cap already provided. To this end, the second mold half 11 comprises an accordingly formed pressure element 14 capable of pressing the webs 12 at the cap 3 in an accordingly tight manner such that an open access to the hollow space 7 will be formed immediately upon removal from the mold.

In the main, it is thus feasible to produce in a cost-effective manner encapsulated sensors appropriately integrated in a package by a few method steps suitable for series and mass production.

What I claim is:

1. A method for housing a semiconductor or IC sensor having an active surface within a package, which method comprises the steps of:

positioning a cap above said active sensor surface, said cap having a recessed undersurface so as to form a hollow space above said active sensor surface, and connecting contacts and bond wires to said sensor;

forming said package by molding a molding compound about the sensor, cap contacts and bond wires; and forming an opening through the molding compound to said hollow space formed above said active sensor surface.

2. A method for housing a semiconductor or IC sensor having an active surface within a package, which method comprises the steps of:

positioning a cap above said active sensor surface, said cap having a recessed undersurface so as to form a hollow space above said active sensor surface, and connecting contacts and bond wires to said sensor; and forming said package by molding a molding compound about the sensor, cap, contacts and wires in a manner which provides an opening through the molding compound to said hollow space formed above said active sensor surface.

3. A method as set forth in claim 1 or 2, wherein said package is formed by injection molding.

4. A method as set forth in claim 1, wherein said opening through the molding compound is formed by sawing after said molding compound has at least partially set.

5. A method as set forth in claim 1, wherein said opening through the molding compound is formed by drilling after said molding compound has at least partially set.

6. A method as set forth in claim 1, wherein said opening through the molding compound is formed by sawing and drilling after said molding compound has at least partially set.

7. A method as set forth in claim 1 or 2, wherein said molding compound is a synthetic material.

8. A method as set forth in claim 1 or 2, further comprising introducing an optical fiber into said hollow space through said opening.

9. A method as set forth in claim 1 or 2, further comprising providing a frame including contact pins connecting said bond wires with said frame prior to the formation of said package, and embedding said frame in said molding compound during formation of said package leaving said contact pins exposed.

* * * * *